(12) United States Patent
Behr et al.

(10) Patent No.: US 10,046,408 B2
(45) Date of Patent: Aug. 14, 2018

(54) DEVICE COMPRISING A CONNECTING COMPONENT AND METHOD FOR PRODUCING A CONNECTING COMPONENT

(71) Applicant: OSRAM OPTO SEMICONDUCTORS GMBH, Regensburg (DE)

(72) Inventors: Barbara Behr, Abensberg (DE); Andreas Ploessl, Regensburg (DE); Mathias Wendt, Hausen (DE); Marcus Zenger, Hausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 408 days.

(21) Appl. No.: 14/724,682

(22) Filed: May 28, 2015

(65) Prior Publication Data
US 2016/0346857 A1 Dec. 1, 2016

(51) Int. Cl.
*B32B 15/00* (2006.01)
*B23K 1/00* (2006.01)
(Continued)

(52) U.S. Cl.
CPC .......... *B23K 1/0016* (2013.01); *B23K 1/0006* (2013.01); *B23K 35/26* (2013.01); *B23K 35/3013* (2013.01); *B23K 35/322* (2013.01); *B32B 7/04* (2013.01); *B32B 9/002* (2013.01); *B32B 9/005* (2013.01); *B32B 15/01* (2013.01); *B32B 15/018* (2013.01); *C22C 5/02* (2013.01); *C22C 5/04* (2013.01); *C22C 13/00* (2013.01); *C22C 28/00* (2013.01); *F27D 3/00* (2013.01); *H01L 24/29* (2013.01); *H01L 24/32* (2013.01);
(Continued)

(58) Field of Classification Search
CPC ............................... B32B 15/00; B32B 15/01
See application file for complete search history.

(56) References Cited

U.S. PATENT DOCUMENTS 5,045,502 A * 9/1991 Lau .................. H01L 21/28575
257/745
6,504,242 B1 * 1/2003 Deppisch ............ H01L 23/3735
257/706
(Continued)

OTHER PUBLICATIONS

Jellison, J.E., "Gold-Indium Intermetallic Compounds: Properties and Growth Rates", Materials Control and Applications Branch (MC&AB), Nov. 8, 1979.
(Continued)

*Primary Examiner* — Rip A Lee
(74) *Attorney, Agent, or Firm* — Cozen O'Connor

(57) ABSTRACT

A device is specified, said device comprising a first component (1), a second component (2), and a connecting component (3) comprising at least a first region (31) and at least a second region (32). The composition of the first region (31) differs from the composition of the second region (32). The connecting component (3) is arranged between the first component (1) and the second component (2). The connecting component (3) comprises different kinds of metals, the first region (31) of the connecting component (3) comprises a first metal (41), and the concentration of the first metal (41) is greater in the first region (31) than the concentration of the first metal (41) in the second region (32).

10 Claims, 5 Drawing Sheets

(51) Int. Cl.
| | |
|---|---|
| *F27D 3/00* | (2006.01) |
| *B32B 15/01* | (2006.01) |
| *B32B 9/00* | (2006.01) |
| *B32B 7/04* | (2006.01) |
| *B23K 35/26* | (2006.01) |
| *B23K 35/30* | (2006.01) |
| *B23K 35/32* | (2006.01) |
| *C22C 5/02* | (2006.01) |
| *C22C 13/00* | (2006.01) |
| *C22C 5/04* | (2006.01) |
| *C22C 28/00* | (2006.01) |
| *H01L 23/00* | (2006.01) |
| *H01L 33/00* | (2010.01) |

(52) U.S. Cl.
CPC .......... *H01L 24/83* (2013.01); *H01L 33/0079* (2013.01); *B32B 2457/00* (2013.01); *H01L 2224/2908* (2013.01); *H01L 2224/29099* (2013.01); *H01L 2224/83825* (2013.01)

(56) References Cited

U.S. PATENT DOCUMENTS

| | | | |
|---|---|---|---|
| 8,471,385 B2 | 6/2013 | Streubel | |
| 2006/0249847 A1* | 11/2006 | Eriksen | C23C 14/021 257/751 |
| 2010/0068552 A1* | 3/2010 | Goerlich | C22C 13/00 428/615 |
| 2010/0127046 A1* | 5/2010 | Mehrotra | H01L 23/3735 228/122.1 |
| 2012/0211793 A1 | 8/2012 | Bergmann et al. | |
| 2013/0037603 A1* | 2/2013 | Choi | H01L 23/49816 228/203 |
| 2014/0008801 A1* | 1/2014 | Chen | H01L 24/29 257/751 |
| 2017/0086320 A1* | 3/2017 | Barber | H05K 5/062 |

OTHER PUBLICATIONS

Search Report and a Written Opinion dated Jul. 27, 2016 which issued in the corresponding International Patent Application No. PCT/EP2016/062401.

* cited by examiner

DEVICE COMPRISING A CONNECTING COMPONENT AND METHOD FOR PRODUCING A CONNECTING COMPONENT

FIELD OF THE INVENTION

This invention is related to a device comprising a connecting component and a method for producing a connecting component.

BACKGROUND OF THE INVENTION

The document U.S. Pat. No. 8,471,385 B2 describes a device comprising a connecting component.

SUMMARY OF THE INVENTION

One object of the invention is to provide a device comprising a connecting component, which can be produced in a particularly cost-saving way. One further object is to provide a method for producing a connecting component, which yields a particularly versatile connecting component.

According to one aspect of the device, the device comprises a first component and a second component. The first component and the second component can be chosen from a various number of materials and objects. For example, the first and/or the second component can comprise at least one of the following materials: semiconductor material, ceramic material, metal material.

For example, at least one of the components can be a semiconductor or ceramic wafer, for example formed with materials such as sapphire, silicon, germanium, $Si_3N_4$, $Al_2O_3$, luminescence ceramic such as YAG. Further, it is possible that at least one of the components is a circuit board, a metallic lead frame or another kind of connection carrier. Moreover, at least one of the components can be an active component such as, for example, an electronic chip, an optoelectronic chip, a light-emitting diode chip, a laser chip, a photodetector chip, or a wafer comprising a plurality of such chips.

In particular, the first component and the second component differ from each other with respect to their composition. For example, the first and the second component each has a mean linear coefficient of thermal expansion wherein the mean linear coefficient of thermal expansion of the first component differs from that of the second component. In other words, the device comprises two components which differ from one another with respect to their mean linear coefficient of thermal expansion.

According to one aspect of the device, the device comprises a connecting component. The connecting component comprises at least a first region and at least a second region. Thereby, it is possible that the connecting component comprises two or more first regions and/or two or more second regions. Further, it is possible that the connecting component comprises further regions like third and fourth regions. Thereby the composition of the different regions, for example the composition of the first region and the composition of the second region differ from each other.

The connecting component is arranged between the first component and the second component and the connecting component is configured to connect the first component with the second component. That is to say the connecting component is a means for connecting the first and the second component with each other. For example, this connection can be a mechanical connection of the first and the second component which is promoted by the connecting component. Further, it is possible that the connecting component is electrically conductive and the connecting component promotes an electrical connection between the first component and the second component.

According to one aspect of the device the connecting component comprises different kinds of metals. That is to say, the connecting component comprises a certain number of different metals, for example four or more different kinds of metals. In this way the connecting component can form a solder material or a solder-like material which promotes a mechanical connection between the first component and the second component.

According to one aspect of the device the first region of the connecting component comprises a first metal wherein the concentration of the first metal is greater in the first region than the concentration of the first metal in the second region. That is to say, the first and the second region of the connecting component at least differ with respect to the concentration of the first metal in said regions.

According to one aspect of the device, the device comprises a first component, a second component and a connecting component, which comprises at least a first region and at least a second region. Thereby, the composition of the first region differs from the composition of the second region, the connecting component is arranged between the first component and the second component, the connecting component comprises different kinds of metals. The first region of the connecting component comprises a first metal and the concentration of the first metal is greater in the first region than the concentration of the first metal in the second region of the connecting component.

When bonding two components, for example, two wafers, which are comprised of different materials and/or show different layer structures mechanical tensions may arise which lead to bending or bowing of the stack of bonded components which can even lead to failure or breaking of at least one of the components. Thereby the magnitude of the bowing or bending of the components is an indicator of the tension between the components. Thereby the tension is composed by the tension of the components and the tension induced by bonding the two components.

The tension induced by bonding of the components is due to different, e.g. linear, coefficients of thermal expansion of the components. For example, at a temperature at which the two components are bonded, no tension arises from the bonding but when the arrangement of the components is cooled down after bonding, the stack of components bows or bends due to the different coefficients of thermal expansion of components. One solution to solve this problem would be to use only components for bonding with each other, which show the same or a similar coefficient of thermal expansion. However, the inventors surprisingly found that an alternative solution to this problem can be given by a connecting component for connecting the first and the second component with each other which allows the bonding of the components in a first step at a relatively low temperature such that only small tensions are induced by the bonding process. Thereby a temperature stable connection between the two components is achieved. In a second step the connecting component is heated to a higher temperature. Thereby the connecting component is configured in such a way that in this second step there is no melting of the connecting component. Therefore the first and the second component are fixed to each other during this second heating step such that there can be no further tensions, which are induced by the second heating process. The inventors found that this can be achieved by using a connecting component having a first metal which has a higher concentration in a first region of the connecting component than in a second region of the connecting component.

Further, a method for producing a connecting component is specified. The connecting component produced by the method can be used to connect the first and the second component of the device. Consequently, all features disclosed for the device are also disclosed for the method and vice versa.

According to one aspect of the method for producing a connecting component an arrangement is provided which comprises at least three layers of metals, said arrangement comprising a first metal, a second metal, a third metal and a fourth metal, wherein said metals are different from each other. In other words at least four or exactly four metals are provided, said metals being arranged in at least three layers. Thereby it is possible that each layer comprises or consists of exactly one of said metals. Further, it is possible that there are two or more layers, which comprise or consist of the same kind of metal. For example, there can be two or more layers, which comprise or consist of the first metal. Further, it is possible that at least one of the layers comprises or consists of two or more of said metals.

According to a aspect of the method for producing a connecting component the arrangement is heated to a first temperature at which the second metal and the third metal melt and form a ternary region comprising the second, the third and the fourth metal.

That is to say, the second and the third metal form for example a transient melt which reacts with the fourth metal to ternary region which comprises the second, the third and the fourth metal. This ternary region can be a multi-phase intermetallic layer. In the device, which comprises the connecting material and where the connecting material connects the first component and the second component, this ternary region mechanically connects the first and the second component and firmly adheres them with each other. In this way the ternary region ensures that in case of a further heating of the device no further tension due to the different coefficients of thermal expansion of the first and the second component can be induced.

According to a further aspect of the method for producing a connecting component the arrangement is heated to a second temperature at which the ternary region and the first metal are at least partly intermixed whereby a first and a second region are produced wherein the composition of the first region differs from the composition of the second region. Thereby the second temperature is in particular higher than the first temperature.

It is believed that during the heating of the arrangement to the second temperature a solid state reaction occurs in which the first metal and the metals of the ternary region at least partly intermix without melting of the first metal and without melting or without completely melting of the ternary region. Due to this solid-state reaction at least the first and the second region form which, for example, are given by further ternary intermetallic regions, which are thermally more stable than the initially formed ternary region. In this way the method leads to a connecting composition which is particularly temperature-resistant and which only leads to small thermal-induced tensions in the device comprising the connecting component.

According to one aspect of the method for producing a connecting component the method comprises the following steps:

providing an arrangement of at least three layers of metals, said arrangement comprising a first metal, a second metal, a third metal and a fourth metal, wherein said first, second third and fourth metals are different from each other, heating the arrangement to a first temperature at which the second metal and the third metal melt and form a ternary region comprising the second, the third and the fourth metal, heating the arrangement to a second temperature at which the ternary region and the first metal are at least partly intermixed whereby a first region and a second region are produced, wherein the composition of the first region differs from the composition of the second region.

In particular it is possible that the steps are performed in the given sequence. Thereby the first temperature is smaller than the second temperature and between the method step of heating the arrangement to the first temperature and the method step of heating the arrangement to the second temperature there can be a further method step where the arrangement is cooled down in order to harden or stabilize the ternary region.

The method allows the connection of first and second components which differ in their linear coefficient of thermal expansion and therefore allows the use of cheaper materials for forming at least one of the components as there is no necessity to choose the components with respect to similar or same coefficients of thermal expansion. Therefore for example thermally and electrically good conducting and cost-saving materials like silicon wafers can be used for bonding for example with sapphire wafers despite their large difference in the coefficient of thermal expansion without leading to waste due to bowing or bending. Further, the produced connecting component is particularly temperature resistant and therefore leads to particularly temperature stable devices.

In the following further aspects of the device and the method are specified. That is to say the following aspects are disclosed for both, the device comprising the connecting component and the method for producing the connecting component.

According to an aspect of the device and the method, the first metal has the smallest concentration of all metals in the second region or the second region is free from the first metal. That is to say the first metal is, for example, a majority element of the first region but in the second region the first metal is the metal which shows the lowest concentration of all metals in the second region or the second region is even free from the first metal.

According to one aspect of the device and the method, the second region of the connecting component comprises a second metal and the concentration of the second metal is greater in the second region than the concentration of the second metal in the first region. For example, the second metal is a majority component of the second region and shows in the second region a greater concentration than in the first region. Thereby it is possible that the second metal has the smallest concentration of all metals in the first region or the first region is free from the second metal.

According to an aspect of the device and the method, the connecting component comprises exactly four different kinds of metal or the connecting component consists of exactly four different kinds of metal. For example, the connecting component then can consist of the following metals: gold, indium, tin and platinum, nickel or palladium. That is to say, the connecting component can be formed from a quaternary system of four metals which are arranged in regions wherein each of the regions forms basically a ternary system, wherein the two ternary systems differ at least in the concentration of the first and the second metal. For example one region comprises the first metal as a majority component and lacks, or nearly lacks, the second metal and the other region comprises the second metal as a majority component and lacks or nearly lacks the first metal.

According to one aspect of the device or the method, the first region and the second region comprise or consist of at least three different kinds of metal. These three different kinds of metal are then chosen from the at least four different kinds of metal of the connecting component.

According to one aspect of the device and the method, the first region and the second region are layers which are in direct contact with each other and which are stacked successively in a direction which runs traverse or perpendicularly to an area of main extent of said layers. The layers representing the first region and the second region can be separated from each other by an interface of the layers. Thereby the interface of the layers is likely not to be smooth but has a rough or undulated shape. This rough or undulated shape of the interface leads to a mechanical connection between the two regions which is, for example, due to an interlock of the two layers at the interface. Therefore, the regions can be, for example, distinguished from each other by determining the concentration of the first metal in both regions: the region with the higher concentration of the first metal is then the first region.

As a result, the two regions can be given by two ternary phases which are interlocked at the interface wherein both ternary phases thermally more stable than the ternary region formed during the method for producing the connecting component when heating to the first temperature. Thereby the regions can be stacked in the direction, which runs traverse or perpendicular to an area of main extension of the layers forming the regions. For example this direction also runs traverse or perpendicular to an area of main extension of the first and/or the second component.

According to one aspect of the device and the method, the different kinds of metals of connecting component are chosen from the group comprising or consisting of: platinum, nickel, palladium, gold, indium, tin. Thereby the first metal is chosen from the group comprising or consisting of platinum, palladium, nickel and the second metal is indium. Thereby the inventors of the present invention used the fact that, for example, indium and tin can be melted by a relatively low temperature. This transient melt then reacts with the third metal, for example gold, to the ternary region, which has a higher melting point than the second and the third metal, indium and tin.

The first metal, platinum or palladium or nickel, then reacts with the ternary region when heating to the second temperature and forms the first and the second region which are thermally more stable than the primary ternary region.

According to one aspect of the device and the method, the first component has a first linear coefficient of thermal expansion, which is, for example, a mean linear coefficient of thermal expansion and the second component has a second linear coefficient of thermal expansion, which, for example, is a mean linear coefficient of thermal expansion for the second component. Thereby the first and the second linear coefficient of thermal expansion may differ at least by a factor of 1.5, e.g. 3, from each other.

That is to say that the first and the second component are not adjusted to each other with respect to their linear coefficient of thermal expansion but the coefficients of thermal expansion of both components largely differ from each other.

It is possible to use such components with strongly different coefficients of thermal expansion in the present device as the method of producing the connecting component yields the ternary region as an intermediate which is characterized by a a melting point significantly higher than that of In or Sn and which fixes these two components to each other during heating to the second temperature such that further bending or bowing is prevented.

According to one aspect of the device and the method the first temperature is between 130° C. and at most 200° C., preferably between at least 140° C. and at most 180° C., wherein the arrangement is kept at the first temperature for a time interval between at least one minute and at most 15 minutes, preferably between at least 5 minutes and at most 10 minutes.

According to one aspect of the device or the method, the second temperature is between at least 260° C. and at most 400° C., preferably between at least 300° C. and at most 350° C. wherein the arrangement is kept at the second temperature for a time interval between at least 15 minutes and at most 480 minutes, preferably between at least 30 minutes and at most 90 minutes.

BRIEF DESCRIPTION OF THE DRAWINGS

Embodiments and developments of the herein-described device and the herein-described method will become apparent from the exemplary embodiments described below in association with the figures. In the figures:

FIGS. 2A, 2B, 2C show a first embodiment of a herein-described method, wherein FIG. 2C shows a second embodiment of a herein-described device;

FIGS. 3A, 3B, 3C show a second embodiment of a herein-described method, wherein FIG. 3C shows a third embodiment of a herein-described device;

FIGS. 4A, 4B, 4C show a third embodiment of a herein-described method, wherein FIG. 4C shows a fourth embodiment of a herein-described device.

FIGS. 5A, 5B, 5C show a fourth embodiment of a herein-described method, wherein FIG. 5C shows a fifth embodiment of a herein-described device.

In the exemplary embodiments and figures, similar and similarly acting constituent parts are provided with the same reference symbols. Thereby the reference symbols are assigned as follows:

Figure 1A:
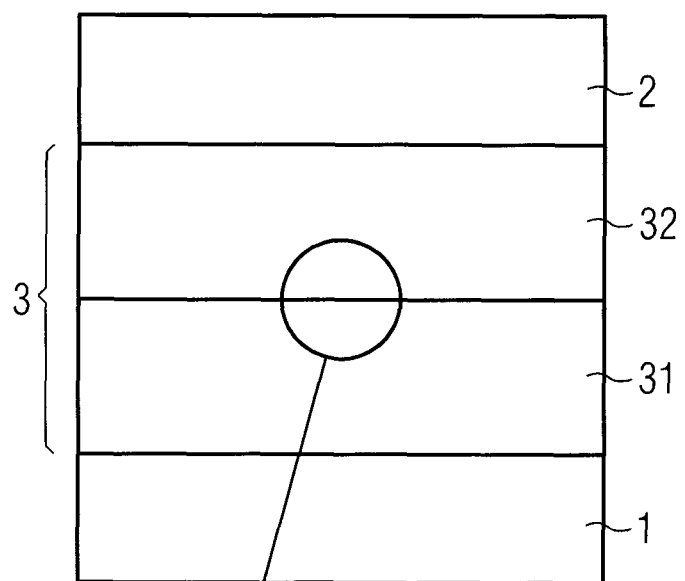
FIG. 1A shows a sectional view of a first embodiment of the herein-described device.

1 first component
11 sapphire substrate
12 first semiconductor layer
13 active layer
14 second semiconductor layer
2 second component
3 connecting component
31 first region
32 second region
312 interface
4 ternary region
41 first metal
42 second metal
43 third metal
44 fourth metal
5 arrangement of layers The elements illustrated in the figures and their size relationship among one another should not be regarded as true to scale. Rather, individual elements may be represented with an exaggerated size for the sake of better representability and/or for the sake of a better understanding.

DETAILED DESCRIPTION OF THE DRAWINGS

FIG. 1A shows a sectional view of a first embodiment of a herein-described device. The device comprises a first component 1 and a second component 2. The first component 1 and the second component 2 are, for example, chosen from the group comprising sapphire, ceramic material, semiconductor material and metal. Thereby the first component and the second component can be chosen in such a way that the linear coefficient of thermal expansion of each component differs from the linear coefficient of thermal expansion of the other component, for example by factor 3 or higher.

A connecting component 3 is arranged between the first component 1 and the second component 2. For example, the connecting component 3 is in direct contact with the first component 1 and the second component 2. The connecting component 3 thereby comprises a first region 31 and a second region 32. For example, the first region 31 consists of the following metals in the following concentrations:
first metal 41, e.g. Pt 11-24 atom %
second metal 42, e.g. In 0-7 atom %
third metal 43, e.g. Sn 42-5 atom %
fourth metal 44, e.g. Au 29-40 atom %

Further, the second region 32 for example consists of the following metals in the following concentrations:
first metal 41, e.g. Pt 0 atom %
second metal 42, e.g. In 13-22 atom %
third metal 43, e.g. Sn 3-10 atom %
fourth metal 44, e.g. Au 71-83 atom %

Further, it is possible that the first region 31 consists of the following metals in the following concentrations:
first metal 41, e.g. Ni 23-25 atom %
second metal 42, e.g. In 0-4 atom %
third metal 43, e.g. Sn 41-45 atom %
fourth metal 44, e.g. Au 28-29 atom %
and the second region 32 then consists of the following metals in the following concentrations:
first metal 41, e.g. Ni 0 atom %
second metal 42, e.g. In 23-29 atom %
third metal 43, e.g. Sn 0-4 atom %
fourth metal 44, e.g. Au 71-76 atom %

In other words, the connecting component 3 of the embodiment of FIG. 1A comprises two ternary regions which both comprise basically three metals each, wherein the whole connecting component 3 consists of four different metals.

Thereby the concentration of the first metal 41 is greater in the first region 31 than the concentration of the first metal 41 in the second region 32. Further, the first metal 41 has the smallest concentration of all metals in the second region 32 or the second region 32 is free from the first metal 41. Further, the second region 32 of the connecting component 3 comprises the second metal 42 which has a concentration in the second region 32 which is greater than the concentration of the second metal 42 in the first region 31. Thereby it is possible that the second metal 42 has the smallest concentration of all metals in the first region 31 or the first region 31 is free from the second metal 42.

In the embodiment of FIG. 1A the first region 31 and the second region 32 are in the shape of layers which are stacked upon each other between the first component and the second component, wherein an area of main extension of the first component 1 or the second component 2 runs basically parallel to the areas of main extension of said layers.

Figure 1B:
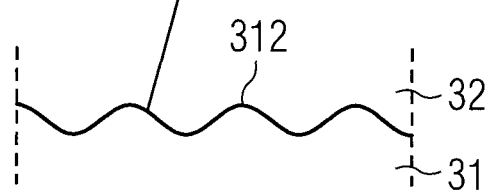
FIG. 1B shows a detail from FIG. 1A.

However, as the detail in FIG. 1B shows, the interface 312 between the first region 31 and the second region 32 is not smooth but has an undulated shape creating an interlock between the two regions, said interlock promoting an adhesive force between the first region 31 and the second region 32.

Figure 2A:
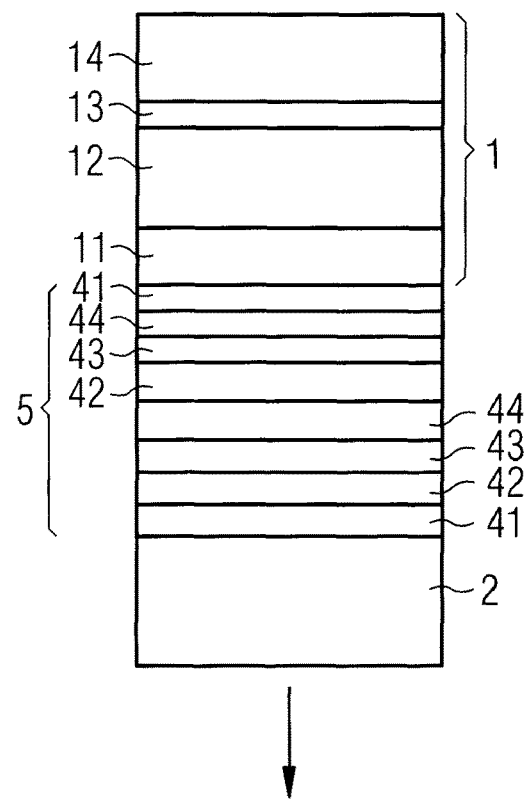
Figure 2B:
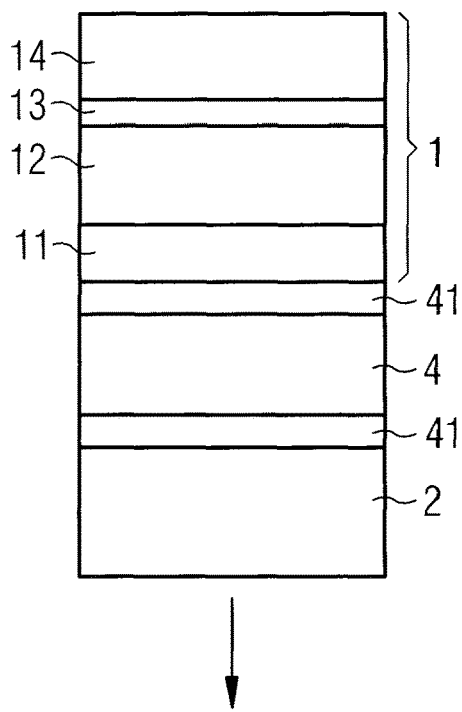
Figure 2C:
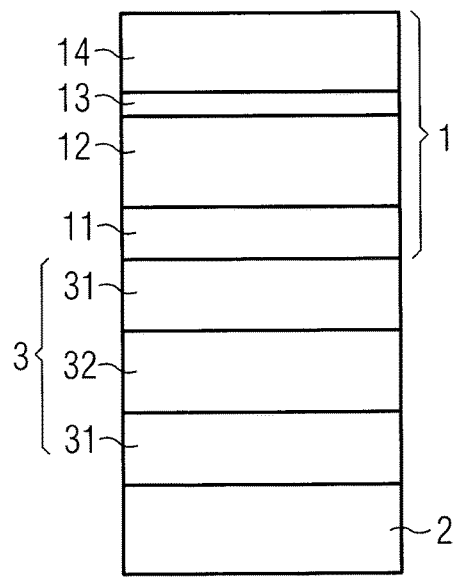

In connection with the sectional view of FIGS. 2A to 2C a first embodiment of a herein-described method for producing a connecting component is described. According to this first embodiment the first component 1 is a wafer of light-emitting diode chips which, for example, emit UV(C)-radiation during operation. The first component 1 thereby comprises a sapphire substrate 11 onto which semiconductor layers 12, 13, 14 are grown using an MOCVD process. For example, these layers are based on AlGaNInN and comprise a first semiconductor layer 12 which is, for example, n-conducting, an active layer 13 and a second semiconductor layer 14 which is, for example, p-conducting.

The second component is a wafer of insulating ceramic material, for example a wafer formed with $Si_3N_4$. Thereby the linear coefficient of thermal expansion of the sapphire substrate 11 is about 6.1 µm per (m K) and the linear coefficient of thermal expansion of the second component 2 formed with the ceramic material is about 1.2 µm per mk. Thereby the second component 2 formed with $Si_3N_4$ shows a high thermal conductivity of about 100 W/(m K). The difference in linear thermal expansion of sapphire and the ceramic material is too high and would lead to such a strong bowing that at least one of the first or the second component would be destroyed when using e.g. $Au_{80}Sn_{20}$ as solder. One solution for this problem would be to use a $Al_2O_3$ ceramic material as second component 2. However, this second component would show a much lower thermal conductivity.

According to the present method, however, the two components 1, 2 can be connected by a herein-described connecting component 3 without destroying the components. Therefore, an arrangement 5 of eight layers of metal is provided comprising platinum as a first metal 41, indium as a second metal 42, tin as a third metal 43 and gold as a fourth metal 44. Thereby the first component 1 and the second component 2 are electrochemically coated with layers of said metals as shown in FIG. 2A. That is to say, on each component 1, 2 the same layer stack of platinum, gold, tin and indium is formed.

In a next method step the arrangement 5 is heated to a first temperature of 147° C. for 15 minutes under a uniaxial pressure of 1.4 MPa.

As shown in FIG. 2B in this way the ternary region 4 is produced comprising the second metal 42, the third metal 43 and the fourth metal 44, that is to say gold, tin, indium respectively. The layers comprising the first metal 41, platinum, does not take part in the reaction.

In a further method step, FIG. 2C, the arrangement is heated to a second temperature of 272° C. without applying an uniaxial pressure for eight hours. Due to a solid state reaction the connecting component 3 is produced in this way comprising two first regions 31 and between them one second region 32. The second region 32 mainly comprises the second, the third and the fourth metal wherein the first region 31 mainly comprises the first metal, the second metal and the fourth metal.

Thereby the first layer 31 is basically free from the second metal 42, for example, indium, and the second region 32 is basically free from the first metal 41, platinum. During the heating of the arrangement 5 to the second temperature neither the layers comprising the first metal 41 nor the ternary region 4 melt. That is to say, the ternary region 4 provides fixation between the first component 1 and the second component 2 during the heating to the second temperature, which prevents the first component 1 and the second component 2 from bowing more strongly despite the applied high temperature and the high difference in linear thermal expansion.

It results in a second embodiment of a herein-described device where a $Si_3N_4$ wafer is bonded by the connecting component 3 to a wafer of LEDs formed the first component 1.

Figure 3A:
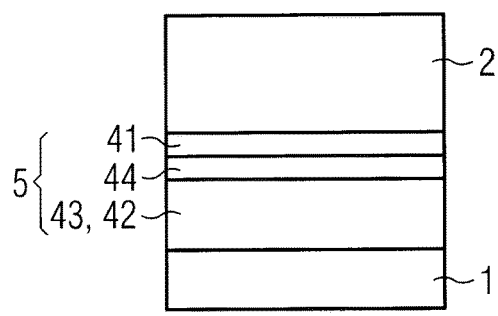
Figure 3B:
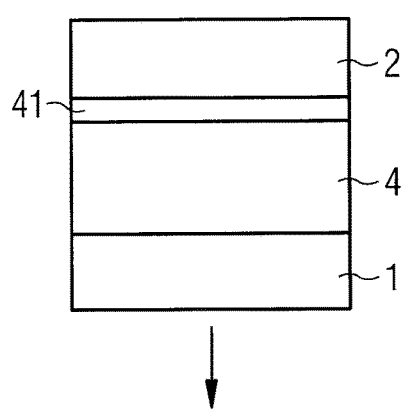
Figure 3:
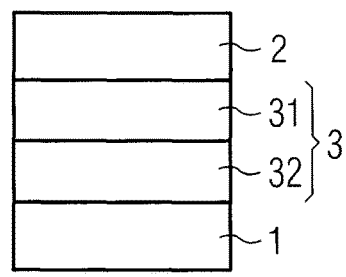

In connection with the sectional views of FIG. 3A to 3C a second embodiment of a here-described method is described. In this embodiment the first component 1 is a ceramic luminescence material in the shape of a platelet which is bonded by the connecting component 3 to a heatsink made of copper 2 which is the second component 2 (see for example FIG. 3C). An arrangement 5 of metallic layers is provided comprising a layer of the first metal 41 which is formed with platinum and a layer of the fourth metal 44 which is formed with gold. Both layers are applied to the second component 2. The first component 1 is coated with a mirror layer, an undercoating (not shown) and a barrier layer (not shown) on which, for example, by cathode sputtering an alloy of the second and the third metal, indium and tin respectively, is coated. This alloy has e.g. a composition of 45 mol % of tin and 55 mol % of indium.

In the next method step, FIG. 3B, the arrangement 5 is heated at a first temperature of 175° C. for about 60 seconds where the ternary region 4 is formed by an isothermic solidification reaction.

Subsequently the temperature is raised to 309° C. with about 10° C. per minute and the second temperature is kept for about 15 minutes. After this the temperature is reduced to room temperature with a cooling rate of about 1° C. per minute. It results in the device shown in FIG. 3C comprising a connecting component 3 with two regions 31, 32 between the components 1, 2. The thus produced device is, for example, a ceramic luminescence material which is bonded to a heatsink. Such a ceramic luminescence material can be illuminated with laser light for stimulating the production of converted radiation, for example light. Thereby due to the heatsink the lost heat produced during the conversion can be dissipated by the heatsink as the connecting component 3 is particularly temperature stable.

Figure 4A:
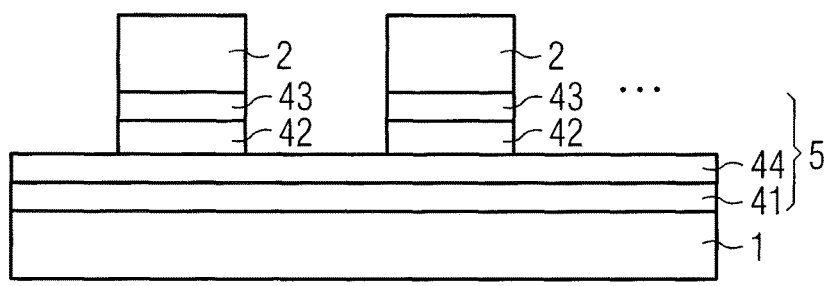
Figure 4B:
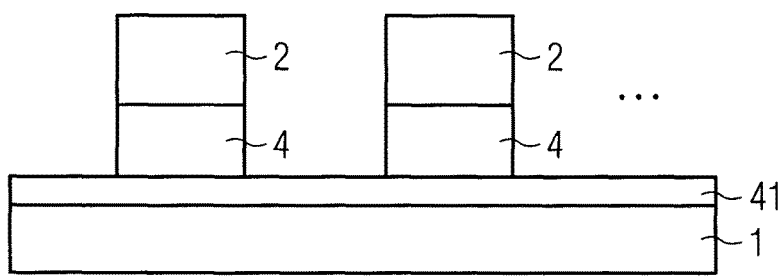
Figure 4C:
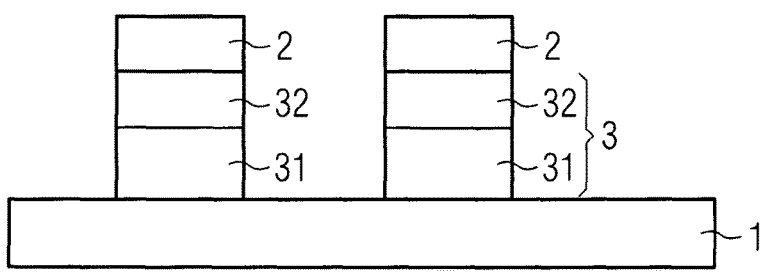

In connection with FIGS. 4A to 4C a further embodiment of a herein-described method is shown in a sectional view. In this embodiment the first component 1 is given by a carrier wafer. That carrier is coated with a layer of the first metal 41, platinum, in a thickness of about 65 nm, onto which a layer of the fourth metal, gold, is applied in a thickness of about 200 nm. Both layers can be applied by cathode sputtering and an undercoating can be applied between the carrier and the layer of the first metal 41 (not shown). A plurality of thin-film LED chips forming the second component 2 is applied to the thus prepared carrier wafer. Each thin-film LED chip, that is to say each second component 2, is provided with a layer of the third metal 43, for example tin and a layer of the second metal, for example indium. These layers have a thickness of about 100 nm and about 120 nm, respectively. Between these layers and the second component 2 an undercoating can be provided which is not shown in figures.

In the next method step, FIG. 4B, the heating of the arrangement to a first temperature is performed, wherein the first component 1 is heated to a temperature of 197° C. and the chips are heated, for example by using a bonding head, to a temperature of about 220° C. Thereby the second components 2 are pressed for 60 seconds with an uniaxial pressure of 3.4 kPa to the second component 2.

In the next method step, FIG. 4C, tempering is performed by a temperature of 350° C. for a time of 25 minutes. It results in the device shown in FIG. 4C, where a plurality of thin-film chips is bonded to a carrier wafer by the connecting component 3. In this embodiment it is possible that the coefficient of thermal expansion of the first component 1 and the second component 2 is nearly identical. Due to this fact, the bonding can be performed by rather high temperatures, which allows for an unexpectedly fast bonding.

Figure 5A:
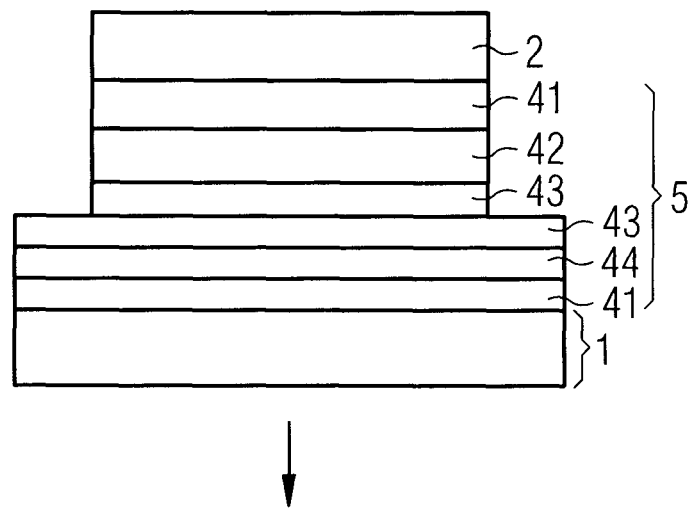
Figure 5B:
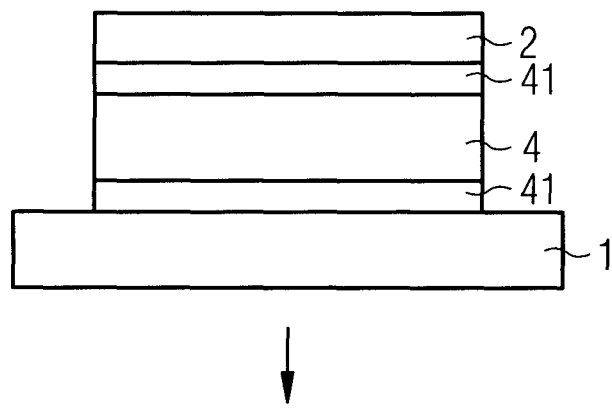
Figure 5C:
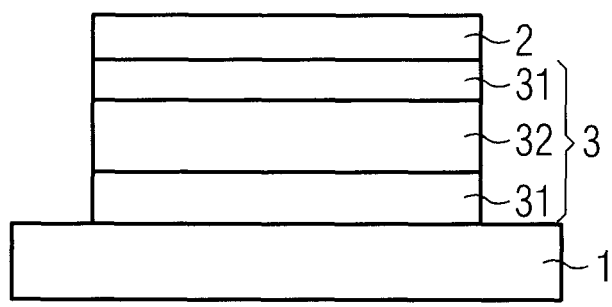

In connection with FIGS. 5A to 5C a further embodiment of the herein-described method is described. In this embodiment a large chip, for example a large light-emitting diode chip having a surface of 4 $mm^2$, forms the second component 2 and this large light-emitting diode chip is soldered to a metallic leadframe which forms the first component 1. Thereby the first and the second components 1, 2 show a large difference in their coefficient of thermal expansion which can lead to an unwanted separation of the chip from the leadframe during operation of the chip. The leadframe, that is to say the first component 1, is coated with a 300 nm thick layer of the first metal 41, platinum, a 3500 nm thick layer of the fourth metal 44, gold, and a 200 nm thick layer of the third metal 43, tin.

The second component, 2, for example the light-emitting diode chip, is coated with a 100 nm thick layer of the first metal 41, platinum, a 1200 nm thick layer of the second metal 42, indium, and a 1600 nm thick layer of the third metal 43, tin.

Then, this arrangement 5 of layers of metal 41, 42, 43, 44 is heated in a first method step to a first temperature, wherein the first component 1 is heated to a temperature of 150° C. and the second component 2 is heated to a temperature of 130° C., wherein the second component is pushed to the first component with a force of 6.5 N for 75 seconds.

In a next method step the temperature is raised for tempering to a temperature of 285° C. for 150 minutes. In this way the connecting member 3 comprises the first region 31 and the second region 32 between the first component 1 and the second component 2 is produced as shown in FIG. 5C.

The herein disclosed invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A device comprising:
   a first component;
   a second component; and
   a connecting component comprising at least a first region and at least a second region,
   wherein a composition of the first region differs from a composition of the second region,
   wherein the connecting component is arranged between the first component and the second component,
   wherein the connecting component comprises four different kinds of metals that are arranged in regions,
   wherein the first region of the connecting component comprises a first metal and a second metal, wherein a concentration of the first metal is greater in the first region than a concentration of the first metal in the second region, wherein each of the regions forms at least a ternary system, wherein the two ternary systems differ at least in the concentration of the first and second metals, wherein the first metal is selected from the group consisting of Pt, Pd and Ni, and wherein the second metal is In.

2. The device according to claim 1, wherein the first metal has a smallest concentration of all metals in the second region or the second region is free from the first metal.

3. The device according to claim 1, wherein the second region of the connecting component comprises a second metal, and wherein a concentration of the second metal is greater in the second region than a concentration of the second metal in the first region.

4. The device according to claim 3, wherein the second metal has a smallest concentration of all metals in the first region or the first region is free from the second metal.

5. The device according to claim 1, wherein the connecting component consists of exactly four different kinds of metal.

6. The device according to claim 5, wherein the first region and the second region comprise at least three different kinds of metal.

7. The device according to claim 1, wherein the first region and the second region are layers that are in direct contact with each other and are stacked successively in a direction that runs traverse or perpendicular to an area of main extension of said layers.

8. The device according to claim 1, wherein the different kinds of metal of the connecting component are selected from the group consisting of Pt, Ni, Pd, Au, In and Sn.

9. The device according to claim 1, wherein the first component and the second component are selected from the group consisting of: sapphire, ceramic material, semiconductor material, and metal.

10. The device according to claim 1, wherein the first component has a first linear coefficient of thermal expansion and the second component has a second linear coefficient of thermal expansion, wherein the first and the second linear coefficient of thermal expansion differ by a factor of 1.5.

* * * * *